(12) United States Patent
Bassi et al.

(10) Patent No.: US 7,388,646 B2
(45) Date of Patent: *Jun. 17, 2008

(54) PERFLUOROPOLYETHERS

(75) Inventors: Mattia Bassi, Milan (IT); Pier Antonio Guarda, Milan (IT)

(73) Assignee: Solvay Solexis S.p.A., Milan (IT)

( * ) Notice: Subject to any disclaimer, the term of this patent is extended or adjusted under 35 U.S.C. 154(b) by 214 days.

This patent is subject to a terminal disclaimer.

(21) Appl. No.: 10/953,768

(22) Filed: Sep. 30, 2004

(65) Prior Publication Data

US 2005/0074686 A1 Apr. 7, 2005

(30) Foreign Application Priority Data

Oct. 3, 2003 (IT) .......................... MI2003A1914

(51) Int. Cl.
G03B 27/42 (2006.01)

(52) U.S. Cl. ..................... 355/53; 359/886; 525/524; 562/1; 568/677

(58) Field of Classification Search ................. 355/53; 568/677; 525/524; 562/1; 359/886
See application file for complete search history.

(56) References Cited

U.S. PATENT DOCUMENTS

| | | | |
|---|---|---|---|
| 3,704,214 A | 11/1972 | Sianesi et al. | |
| 3,715,378 A | 2/1973 | Sianesi et al. | |
| 3,722,792 A | 3/1973 | Lawrence et al. | |
| 4,178,465 A | 12/1979 | Belardinelli et al. | |
| 4,480,910 A * | 11/1984 | Takanashi et al. | 355/30 |
| 4,509,852 A * | 4/1985 | Tabarelli et al. | 355/30 |
| 4,523,039 A | 6/1985 | Lagow et al. | |
| 5,149,842 A | 9/1992 | Sianesi et al. | |
| 5,258,110 A | 11/1993 | Sianesi et al. | |
| 5,872,157 A | 2/1999 | DeSimone et al. | |
| 6,891,596 B2 * | 5/2005 | Rostalski et al. | 355/53 |
| 7,056,646 B1 * | 6/2006 | Amblard et al. | 430/311 |
| 2002/0163629 A1 * | 11/2002 | Switkes et al. | 355/53 |
| 2005/0036184 A1 * | 2/2005 | Yeo et al. | 359/15 |
| 2005/0075517 A1 * | 4/2005 | Marchionni et al. | 568/677 |
| 2006/0012765 A1 * | 1/2006 | Kameyama | 355/53 |

FOREIGN PATENT DOCUMENTS

| | | |
|---|---|---|
| EP | 0 393 700 A1 | 10/1990 |
| EP | 0 790 270 A2 | 8/1997 |
| EP | 1 388 555 A2 | 2/2004 |
| EP | 1 454 938 A1 | 9/2004 |
| EP | 1521118 A2 * | 4/2005 |
| WO | WO 97/35906 A1 | 10/1997 |
| WO | WO 02/06375 A2 | 1/2002 |
| WO | WO 02/12404 A2 | 2/2002 |
| WO | WO 02/38718 A2 | 5/2002 |
| WO | WO 03/077034 A | 9/2003 |

OTHER PUBLICATIONS

Sianesi, Dario, et al., "Perfluoropolyethers (PFPEs) from Perfluoroolefin Photooxidation", Organofluorine Chemistry: Principles and Commercial Applications, Plenum Press, New York, 1994, pp. 431-461.

Marchionni, Giuseppe, et al., "Perfluoropolyethers: Synthesis and Commercial Products", Fluoropolymers '92, Jan. 6-8, 1992 at UMIST Manchester, Paper 14, pp. 1-13.

Giuseppe "Marchionni et al, Perfluoropolyethers: Synthesis and Commercial Products"; Fluoropolymers Conference 1992; 6th-8th Jan. 1992, UMIST Manchester, Paper 14, pp. 1-13.

Dario Sianesi et al, "Perfluoropolyethers (PFPES) From Perfluoroolefin Photooxidation"; Organofluorine Chemistry: Principles and Commercial Applications, Plenum Press, New York, 1994, pp. 431-461.

* cited by examiner

*Primary Examiner*—Peter D. Mulcahy
*Assistant Examiner*—Henry S. Hu
(74) *Attorney, Agent, or Firm*—Arent Fox LLP

(57) ABSTRACT

Use in optical systems as liquids to transmit light at wave lengths lower than 250 nm, in particular at 157 nm, of perfluoropolyethers having the following formula:

$$X_1-O(CF_2O)_n(CF_2CF_2O)_m(CF_2CF_2CF_2O)_p(CF_2CF_2CF_2CF_2O)_q-X_2 \quad (I)$$

wherein:
the repeating units —$CF_2O$—, —$CF_2CF_2O$—, —$CF_2CF_2CF_2O$—, —$CF_2CF_2CF_2CF_2O$— are statistically distributed along the chain;
—$X_1$ and —$X_2$ are perfluoroalkyl chain end groups equal to or different from each other, having formula —$(CF_2)_zCF_3$ wherein z is 0 or an integer from 1 to 3;
n, m, p, q are 0 or integers comprised between 1 and 100, with the proviso that:
at least one among n, m, p and q is different from zero;
the ratio between the oxygen atoms and the carbon atoms (O/C) is higher than 0.33;
wherein the chlorine atoms, determined by $^{19}F$-NMR are substantially absent.

7 Claims, No Drawings

PERFLUOROPOLYETHERS

The present invention relates to the use of liquids having a lower absorbance at wave lengths lower than 250 nm, in optical applications, in particular in the immersion lithography.

More specifically the present invention relates to the use of specific perfluoropolyethers, having a lower absorbance at wave lengths lower than 250 nm, in optical applications, in particular in the immersion lithography.

Still more specifically the liquids of the present invention are usable in the immersion lithography wherein a wave length of 157 nm is used.

It is well known that in every system utilizing electromagnetic radiation to build or project the imagine of an article, the resolution limit is fixed by the diffraction phenomenon. A common definition of the resolution of an optical system operating in diffraction limit is the Rayleigh criterium, generally expressd by the equation:

$$r_o = k_1 \lambda / NA$$

wherein $r_o$ is the resolution; $\lambda$ is the wave length; $k_1$ is a constant, called Rayleigh constant, which depends on the lighting and projection or collecting optics; NA is the number opening, defined as NA=n sin$\theta_o$, wherein n is the medium refractive index and $\theta_o$ is the system half-opening angle or lens collecting angle.

The minumum critical size (details) which is possible to solve is connected to the $r_o$ resolution. In particular, in the lithographic projection systems currently used for the production of integrated electronic devices, wherein the mask imagine is projected on a photoresistive material deposited on a silicon wafer, the $r_o$ resolution defines the minimum size of the details drawable on the integrated circuit. By decreasing $r_o$, the density of the printable electronic circuits on the integrated devices increases. The $r_o$ decrease can be obtained as follows:

1) $\lambda$ decrease, modifying the sources used to generate the light radiation in the projection apparatus. It was possible to reduce the wave length by using the KrF (248 nm) and ArF (193 nm) as laser sources respectively and recently the $F_2$ as laser source (157 nm). The use of wave lengths lower than 157 nm is strongly hindered by the substantial absence of suitable laser sources and optical materials. At present laser sources having wave lengths lower than 157 nm are not commercially available.

2) $k_1$ decrease: with the view of decreasing the Rayleigh constant from the values of the first years 90 (0.7-0.9) to values lower than 0.5, representing the today's available limit of the conventional lithography techniques, a series of RET defined techniques (resolution enhancement techniques) have been developed.

3) Increase of the NA number opening. The intrinsic limit of this size in air or vacuum (n=1) is 1. The introduction of an index matching medium having a refractive index higher than 1 between the sample and the first optical element, generally a lens, is a known technique and it has allowed the development, for example, of the immersion microscopy, with a significant increase of the obtainable number openings.

As index matching medium, fluids are meant in the prior art having a refractive index value close to that of the substratum (for ex. photoresist) and anyway higher than 1 and capable to transmit the light in an optical system for the required optical way.

The essential requirement of the index matching medium to be used in these applications is that the absorbance be sufficiently low to guarantee the substantially unaltered passage of the light beam for all the optical route. The liquid layer crossed by the light between the last optical element and the substratum defines the distance (Working Distance, WD) separating these two elements. They, for example, in lithographic apparatus, can be in a very rapid relative movement. The possibility to increase this distance allows to simplify a series of problems of the apparatus drawing and accomplishment, for example the mechanical tolerances, the fluido dynamic and the heat exchange.

The use of liquids in lithographic systems is well known in the prior art, see for example U.S. Pat. No. 4,509,852 and U.S. Pat. No. 4,480,910. In these patents reference is made to the use of wave lengths of the order of 248 nm or higher. In U.S. Pat. No. 4,480,910 the liquids used are water, trichlorotrifluoroethane, chlorobenzene; in U.S. Pat. No. 4,509,852 the used liquids are benzene, monobromobenzene, 1-bromo-2-iodobenzene, dimethylnaphthalene, ethylnaphthalene, 2,3-dimethylaniline, 2-phenylethylamine, isopropyloxybenzene, monobromonaphthalene.

In said patents no reference is made to the fact that said liquids are transparent at 157 nm.

In patent application USP 2002/0163629 the use of perfluoropolyethers (PFPE) for lithographic apparatus working at wave lengths lower than 220 nm and in particular at 157 nm, has been described. In this patent application absorbance data for the perfluoropolyether commercially known as Fomblin® Z are reported. In this patent application it is stated that the absorbance of this liquid at 157 nm allows to use a Working Distance of 50 μm, corresponding to a light transmittance of 90%.

The need was felt to have available liquids having, in the range of wave lengths lower than 250 nm, in particular at 157 nm, a significantly lower absorbance in comparison with the perfluoropolyethers of the prior art. This would allow to utilize higher Working Distance values, for example a Working Distance of 1 mm with a light transmittance of 90%.

The Applicant has surprisingly and unexpectedly found liquids satisfying the above technical problem.

An object of the present invention is the use in optical systems as liquids to transmit light at wave lengths lower than 250 nm, in particular at 157 nm, of perfluoropolyethers having the following formula:

$$X_1-O(CF_2O)_n(CF_2CF_2O)_m(CF_2CF_2CF_2O)_p(CF_2CF_2CF_2CF_2O)_q-X_2 \quad (I)$$

wherein:

the repeating units —$CF_2O$—, —$CF_2CF_2O$—, —$CF_2CF_2CF_2O$—, —$CF_2CF_2CF_2CF_2O$— are statistically distributed along the chain;

—$X_1$ and —$X_2$ are perfluoroalkyl chain end groups equal to or different from each other, having formula —$(CF_2)_z CF_3$ wherein z is an integer from 0 to 3;

n, m, p, q are integers comprised between 0 and 100, with the proviso that:

at least one among n, m, p and q is different from zero;

the ratio between the oxygen atoms and the carbon atoms O/C is higher than 0.33;

wherein the chlorine atoms, determined by $^{19}F$-NMR are substantially absent.

With substantially absent chlorine atoms it is meant that their amount is lower than the sensitivity limit of the analytical $^{19}$F-NMR method, i.e. lower than 1 meq/Kg of liquid of formula (I).

The products of formula (I) have number average molecular weight from 220 to 60,000, preferably from 285 to 40,000 and are liquid at the temperature of 20° C.

As said, the perfluoropolyethers of formula (I) are used as index matching medium to be interposed between the substratum and at least one part of the light projection or collecting optical system.

The perfluoropolyethers of the present invention are linear PFPEs as reported in formula (I) and show an absorbance at 157 nm of one order of magnitude lower with respect to the commercial PFPEs. See the Examples.

In particular the Applicant has surprisingly and unexpectedly found that the absorbance of the invention compounds is lower than that of the known PFPEs having a similar structure (ex. Fomblin® Z, Fomblin® M).

Tests carried out by the Applicant have shown that the perfluoropolyethers of the present invention at the wave length of 157 nm have clearly lower absorbance values even in comparison with other known perfluoropolyethers of the prior art. With other perfluoropolyethers of the prior art, the products marketed with the names Demnum®, Krytox®, Fomblin® Y are meant.

Therefore it was quite unexpected that the compounds of formula (I) were particularly suitable for optical applications at wave lengths lower than 250 nm, and in particular for lithography projection systems operating by immersion at 157 nm, having lower absorbance values.

Furthermore the Applicant has found that the good optical properties of the compounds of the present invention are independent of the number average molecular weight. See the Examples.

Therefore with the compounds of the invention it is possible to modulate the rheological characteristics of the product (connected to the molecular weight) without modifying the perfluoropolyether optical properties. This is an advantage since with the compounds of formula (I) it is possible to satisfy a wide range of fluid-dynamic conditions wherein optical systems operate.

The liquid perfluoropolyethers of the present invention are preferably used substantially free from dissolved gases, in particular oxygen. With the substantially free from oxygen wording, it is preferably meant that the residual oxygen concentration in the liquid is not higher than $2 \cdot 10^{-5}$ meq/Kg of polymer. The treatment is generally carried out under vacuum, for example $10^{-3}$ mbar, generally by using a mechanical pump. The degassing is preferably carried out by initially maintaining the sample at room temperature and then by cooling it in liquid nitrogen. If the perfluoropolyether shows a low boiling point, preferably the process is carried out by cooling the compound with liquid nitrogen and subsequently by carrying out the degassing.

The perfluoropolyethers of the present invention are particularly suitable to be used as index matching medium in lithographic systems operating in immersion at wave lengths lower than 250 nm and in particular at 157 nm.

The perfluoropolyethers of formula (I) of the present invention are obtainable by a process comprising the following steps:

a) synthesis of the peroxidic perfluoropolyether, carried out by one of the following reactions:
  a1) TFE photooxidation, in the presence of UV light, at low temperature, generally from −40° C. to −100° C., in solvents liquid under the reaction conditions selected between perfluorocarbons and (mono)hydrofluorocarbons, represented by the following general formula:

$$C_yF_{(2y+2-x)}H_x \qquad (II)$$

wherein y is an integer from 2 to 4; x is an integer equal to 0 or 1;
  in the presence of fluorine, as regulating agent of the molecular weight, diluted with an inert gas; or
  a2) TFE oxidation using as radical initiator fluorine or hypofluorites of formula $$R_fOF \qquad (III)$$

$R_f$ being a pefluoroalkyl radical from 1 to 3 carbon atoms,
  by operating in the temperature range from −40° C. to −100° C. at a pressure between 0 and 12 bar, in an inert solvent under the reaction conditions, also containing chlorine;

b) thermal treatment of the peroxidic product obtained in step a) at a temperature from 150° C. to 250° C., optionally in the presence of a molecular weight regulating agent selected between elemental fluorine or hypofluorite of formula (III);

c) treatment with elemental fluorine of the polymer obtained in b) at temperatures from 100° C. to 250° C., or by treatment with fluorine in the presence of UV radiations, by operating at temperturess from −50° C. to 120° C.

In step a1) the fluorine is generally added in such amount that the molar ratio fluorine/tetrafluoroethylene is in the range $2 \cdot 10^{-2}$-$1.2 \cdot 10^{-3}$, preferably $1.2 \cdot 10^{-2}$-$1.7 \cdot 10^{-3}$ and is diluted with an inert gas in ratios by volume from 1/50 to 1/1,000.

In step a1) the used solvents are preferably the following: perfluoropropane $(C_3F_8)$, hydropentafluoroethane $(C_2F_5H)$ and 2-hydroheptafluoropropane $(CF_3CFHCF_3)$, $C_4F_9H$ (for example $CF_3CFHCF_2CF_3$, $(CF_3)CH$, $HCF_2CF_2CF_2CF_3$).

The solvent used in step a1) is liquid at the syntehsis temperatures (−40°-80° C.) and solubilizes the peroxidic polymer even at high molecular weights forming an homogeneous solution. This represents a remarkable advantage of the invention process since there is no separation of the peroxidic polymer. This makes possible the industrial use of the invention process since cloggings of the industrial plant piping due to uncontrolled viscosity increases do not occur; the thermal exchanges are extremely effective and this avoids uncontrolled degradation of the peroxidic polymer.

Besides it has been unexpectedly found that the solvents used in step a1) allow a high reaction kinetics, such to maintain high productivity combined with a low peroxide content in the polymer, lower than 4-5 (g of active oxygen/100 g of polymer), to avoid the explosion risk.

It has been unexpectedly found that the use of fluorine diluted as molecular weight regulating agent in step a1) allows to control the reaction mass viscosity so to favour the thermal exchange, avoiding the polymer separation from the solvent during the synthesis.

As said, the fluorine used in step a1) must be diluted with a gas. Generally an inert gas, for example nitrogen or helium, is used as diluting gas. To dilute the fluorine also the oxygen can be used, being the latter a reactant in the invention reaction. Indeed it has been found by the Applicant that, if undiluted fluorine is used, the fluorine produces uncontrolled local reactions and gaseous decomposition products leading to process interruptions due to fouling of the reactor and of the optical system (UV lamp) in the case of polymerization in the presence of UV radiations. Furthermore in these cases there can be an uncontrolled (peroxidic content) P.O. increase, higher than 4-5 (g of active oxygen/100 g of polymer), leading to explosion risks in the system. When used diluted, the fluorine acts in step a1) as molecular weight regulator with a very high selectivity, of the order of 90%.

The Applicant has furthermore found that the fluorine, in step a1) reduces and substnatially eliminates the reaction induction times avoiding the use of reaction activators.

In step a2), wherein the TFE oxidation is carried out without the use of the UV light, the used solvents can be those above mentioned, or chlorinated solvents. For example $CF_2Cl_2$, optionally in admixture with $COF_2$, can be mentioned.

The step a) and step b) of the process of the present invention can be carried out in a discontinuous, semicontinuous or continuous way.

Step b) ends when in the polymer the peroxide results substantially absent. With substantially absent it is meant that its value (P.O.) is equal to or lower than the sensitivity limit of the used analytical method (1 ppm). See the Examples.

In step b) generally the fluorine or the hypofluorites of formula (III), when present, are used with a flow-rate, expressed by moles h/Kg polymer from 110-2 to 3, preferably from $2·10^{-2}$ to 2.

Step c) is usually carried out in a discontinuous way. The reaction ends when, by $^{19}$F-NMR analysis, it is observed that the functional end groups (mainly —$OCF_2COF$ and —OCOF) have been transformed into perfluoroalkyl end groups (method sensitivity limit: 1 meq/Kg polymer).

Optionally the product can be distilled to obtain fractions having a determined number average molecular weight and a determined molecular weight distribution.

The following Examples are given for illustrative and not limitative purposes of the present invention.

EXAMPLES

Absorbance Measurement Method

The absorbance measurements have been carried out on a VUV (vacuum UV) spectrometer operating under vacuum equipped with a hydrogen vapour lamp and a 1200 lines/mm chromo-iridium grid capable to carry out transmission and reflection measurements between 100 and 250 nm with a 0.5 nm resolution.

The samples have been put in an aluminum seal cell equipped with two $CaF_2$ windows separated by a PTFE spacer having a thickness ranging between 25 micron and 2 nm. The measurement has been carried out with a double ray technique capable to compensate possible variations of the lamp intensity. The absorbance values have been calculated by substracting from the experimental measurement the absorption of the windows obtained with the empty cell. The transmittance measurement accuracy is of the order of 5%. The reported absorbances have been calculated by the relation $$A(cm^{-1})=\log_{10}(T)/s,$$

wherein T is the transmittance and s is the thickness (in cm) of the spacer interposed between the windows.

The samples have been carefully degassed to remove the dissolved gases, by treatment under vacuum with a mechanical pump ($10^{-3}$ mbar) by initially maintaining the sample at room temperature and then cooling it with liquid nitrogen. The degassed product has been kept in glass phial equipped with gastight "Rotaflo" tap.

The measurement cell has been filled and sealed in drybox fluxed with nitrogen to avoid air absorption from the sample.

Determination of the Amount of Chlorinated End Groups as Meq/Kg.

The amount is calculated by the following formula:

$$\frac{1000 \times 2 \times (\% -CF_2Cl + \% -CF_2CF_2Cl) \times 10}{Mn}$$

wherein:

($\% -CF_2Cl+\% -CF_2CF_2Cl$)=sum of the molar percentages of the chlorinated end groups, determined by $^{19}$F-NMR.

Mn=number average molecular weight, determined, for example, by $^{19}$F-NMR.

The method sensitivity limit is 1 meq/Kg.

Determination Method of the Peroxide Amount (P.O.)

The analysis of the peroxide content is carried out by iodometric titration, according to the following method. A weighed polymer amount (some grams) is dissolved in about 20 ml of Galden® ZT 130 (hydrofluoropolyether having —$CF_2H$ end groups) produced by the Applicant. 1 ml of glacial acetic acid and 30 ml of a sodium iodide solution 5% w/w in isopropyl alcohol are added. The resulting suspension is left under stirring for 15 minutes, until complete iodide dissolution. The iodine developed from the reaction with the peroxide is titred with an aqueous solution of sodium thiosulphate having a known titre by using a potentiometric titrer Mettler® DL 40, equipped with platinum electrode and reference electrode.

The peroxide (P.O.) content is expressed in g of active oxygen (m.w. 16)/100 g of polymer.

The method sensitivity limit is 1 ppm.

Determination Method of the Kinematic Viscosity

The determination is carried out with Cannon-Fenske type viscometers previously conditioned at 20° C.

Determination Method of the Number Average Molecular Weight

The molecular weight is determined by $^{19}$F-NMR, by using an instrument operating at a 400 MHZ frequency.

The spectrum shows the signals due to the fluorine atoms linked to the main chain end groups ($CF_3O$—, $CF_3CF_2O$—, $ClCF_2O$, $ClCF_2CF_2O$—, $FC(O)CF_2O$—, $FC(O)O$—) and to the repeating units present in the polymeric chain.

From the ratio between the signals of the fluorine atoms linked to the end groups and respectively to the repeating units present in the polymeric chain it is calculated the number average molecular weight.

Determination Method of the Ratio Oxygen Atoms/Carbon Atoms (O/C)

By the previous polymer $^{19}$F-NMR analysis, the molar relative percentages of the various repeating units are determined. From the number of carbon and oxygen atoms contained in each repeating unit present, it is calculated the molar O/C ratio.

Example 1

Synthesis of a Perfluoropolyether Free from Chlorinated End Groups Having Number Average Molecular Weight 19,400 and O/C Ratio=0.70 a) Synthesis of the Peroxidic Perfluoropolyether

A cylindrical photochemical reactor is used, equipped inside with coaxial sheath wherein a high pressure mercury lamp (Hanau TQ 150) is inserted, cooled by circulating fluid (Galden® D100) transparent to the UV radiations emitted by the lamp, furthermore equipped with a condenser maintained at −75° C. and with feeding lines of the reacting gases, which is cooled at −50° C. by an external bath. 850 g of 2-hydroheptafluoropropane (R 227 ea) are introduced. Then one starts to feed 18.0 Nl/h of oxygen and immediately afterwards the UV lamp is switched on. Then 9.0 Nl/h of tetrafluoroethylene are fed through a separated bubbling inlet and 2.5 Nl/h of a 1% molar fluorine mixture in nitrogen, fed together with the oxygen; the reactant flow-rates are maintained constant for the whole duration of the test (300 minutes), maintaining the reactor temperature at −50° C.

During the whole time of the reaction the solution remains homogeneous.

At the end of the reaction the reactant feedings are interrupted, the UV lamp is switched off and the solvent and the gaseous by-products are let evaporate. The weight of the recovered product, after degassing, is 91.3 g P.O. =2.28; the $^{19}$F-NMR analysis confirms the following structure:

$$X_3-O(CF_2O)_{n1}(CF_2CF_2O)_{m1}(O)_h-X_4$$

wherein the —$X_3$ and —$X_4$ end groups are equal to or different from each other. The end groups and the respective molar percentages with respect to the total of the end groups are the following: —$CF_3$, 41.2%; —$CF_2CF_3$, 42.4%; —$CF_2COF$, 16.3%. The number average molecular weight is 18,000; h/(n1+m1)=0.108, m1/n1=0.90; O/C=0.76.

b) Thermal Treatment 58.7 grams of the product obtained in the previous step are introduced in a glass reactor equipped with magnetic stirrer, with sheath for temperature measurement by thermocouple, with nitrogen inlet and gaseous products outlet. 5 Nl/h of nitrogen are fed for the whole duration of the test. The system temperature is gradually increased under stirring by oil bath until reaching 150° C. 150° C. are maintained for 1 h. Successively the temperature is increased of 10° C. every hour until reaching 190° C. The reaction mixture is maintained for two hours at this temperature. Then the reaction temperature is increased of 10° C. every two hours until reaching 230° C. After two hours at this temperature, the reaction mixture is treated at 235° C. for 4 h.

At the end it is cooled and 41.2 g of product are recovered resulting free from peroxide; the $^{19}$F-NMR analysis confirms the following structure:

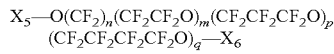

$$X_5-O(CF_2)_n(CF_2CF_2O)_m(CF_2CF_2CF_2O)_p(CF_2CF_2CF_2CF_2O)_q-X_6$$

wherein the —$X_5$ and —$X_6$ end groups are equal to or different from each other. The end groups and the respective molar percentages with respect to the total of the end groups are the following: —$CF_3$, 37.6%; —$CF_2CF_3$, 42.7%; —$CF_2COF$, 19.7%. The number average molecular weight is 19,000; m/n=0.59; (p+q)/(m+n+p+q)=0.023; n/(n+m+p+q)=0.613; O/C=0.70.

c) Neutralization of the Acid End Groups

The product obtained in step b) is treated with elementary fluorine (5 Nl/h) at 230° C. for 10 h. 39.7 g of product are obtained, having the following structure:

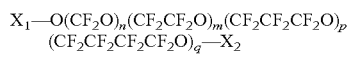

$$X_1-O(CF_2O)_n(CF_2CF_2O)_m(CF_2CF_2CF_2O)_p(CF_2CF_2CF_2CF_2O)_q-X_2$$

wherein the —$X_1$ and —$X_2$ end groups are equal to or different from each other. The end groups and the respective molar percentages with respect to the total of the end groups are the following: —$CF_3$, 59.0%; —$CF_2CF_3$, 41.0%. The number average molecular weight is 19,400; m/n=0.60; (p+q)/(m+n+p+q)=0.023; n/(n+m+p+q)=0.613; O/C=0.70.

The $^{19}$F-NMR analysis confirms the absence of chlorinated end groups in the product.

The analytical characteristics of the product, in particular the absorbance at 157 nm, are reported in Table 1.

Example 2

Synthesis of a Perfluoropolyether Free from Chlorinated End Groups Having Number Average Molecular Weight 4,000 and O/C=0.54 a) Synthesis of the Peroxidic Perfluoropolyether 20 litres of a mixture of dichlorodifluoromethane and $COF_2$ in molar ratio 1:1 are introduced in a 25 l AISI steel reactor at the temperature of −80° C. 400 Nl/h of oxygen are fed bringing the reactor inside to the pressure of 10 absolute bar. Then 2 Nl/h of fluorine and 224 Nl/h of TFE are fed, maintaining pressure and temperature at the above values for 180 minutes.

At the end of the reaction 2.4 kg of product having P.O.=2.7 are recovered. The $^{19}$F-NMR analysis confirms the following structure:

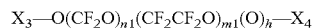

$$X_3-O(CF_2O)_{n1}(CF_2CF_2O)_{m1}(O)_h-X_4$$

wherein the —$X_3$ and —$X_4$ end groups are equal to or different from each other. The end groups and the respective molar percentages with respect to the total of the end groups are the following: —$CF_3$, 2.0%; —$CF_2CF_3$, 98.0%. The number average molecular weight is 16,200; h/(n1+m1)=0.198; m1/n1=6.8; O/C=0.64.

b) Thermal Treatment

A 500 ml glass flask is used, equipped with stirrer, sheath for the temperature control, dropping funnel, two way pipe-fitting for the addition of the transfer agent methyl hypofluorite ($CF_3°$ F.) and outlet of the reaction gases (mainly $COF_2$), glass inlet pipe for the continuous outflowing of the obtained product, having an height such that the reaction mass level in the reactor remains constant. 195 g of peroxidic perfluoropolyether obtained in the previous step are fed and it is slowly heated with oil bath under stirring until reaching the temperature of 230° C. Successively one starts to continuously feed in the reactor the peroxidic perfluoropolyether with a flow-rate equal to 172 g/h and contemporaneously the methyl hypofluorite transfer agent with a flow-rate of 1.2 Nl/h. These flow-rates are maintained constant for 10 h, continuously collecting the reaction product.

At the end of this period of time, the reaction is interrupted. The collected product, corresponding to an amount of 1,375 g, is heated to 240° C. in a reactor under stirring until removing the residual P.O. amounts.

The obtained product has the following structural formula:

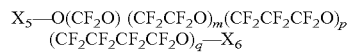

$$X_5-O(CF_2O)(CF_2CF_2O)_m(CF_2CF_2CF_2O)_p(CF_2CF_2CF_2CF_2O)_q-X_6$$

wherein the $X_5$, $X_6$ end groups are equal to or different from each other. The end groups and the respective molar percentages with respect to the total of the end groups are the following: $CF_3$—, 8.0%; $CF_3CF_2$—, 85.5%; $CF_3CF_2CF_2$—, 3.0%; $CF_3CF_2CF_2CF_2$, 3.0%; —$CF_2COF$, 0.5%. The number average molecular weight is 4,000 and the molar ratios of the chain units are respectively m/n=2.34, (p+q)/(m+n+p+q)=0.078 and n/(n+m+p+q)=0.276; O/C=0.54.

c) Neutralization of the Acid End Groups by Photochemical Route

The product obtained in step b) is introduced in a photochemical reactor equipped with a 150 W high pressure mercury lamp and a photochemical fluorination is carried out at the temperature of 50° C. with a gaseous fluorine flow equal to 5 litres/h for 11 hours in total.

By the $^{19}$F-NMR analysis the product results to have the following structure:

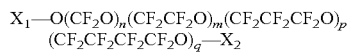

$$X_1-O(CF_2O)_n(CF_2CF_2O)_m(CF_2CF_2CF_2O)_p(CF_2CF_2CF_2CF_2O)_q-X_2$$

wherein $X_1$, $X_2$ are equal to or different from each other. The end groups and the respective molar pecentages with respect to the total of the end groups are the following: —$CF_3$, 10.0%; $CF_3CF_2$—, 85.0%; $CF_3CF_2CF_2$—, 2.5%; $CF_3CF_2CF_2CF_2$—, 2.5%. The number average molecular weight is 4,000. The molar ratios of the chain units are the following: m/n=2.34, n/(m+n+p+q) 0.276, (p+q)/(m+n+p+q)=0.078, O/C=0.54.

The analytical characteristics of the product, in particular the absorbance at 157 nm, are reported in Table 1.

Example 3-5 Comparative

The commercial products Fomblin® Z and Fomblin® M are obtained by photochemical process wherein as reaction solvent, CFC 12 ($CF_2Cl_2$) is used, followed by thermal treatment and subsequent neutralization of the acid end groups (D. Sianesi et al. "Organic Fluorine Chemistry, Principles and Commercial Applications", Plenum Press 1994, pages 431-461, in particular pages 431-440, G. Marchionni et Al "Perfluoropolyethers: Synthesis and Commercial Products" in "Fluoropolymers '92 6th-8 Jan. 1992 at UMIST—Manchester" Paper 14).

Three different commercial Fomblin® Z samples have been analyzed as from Table 1.

In the Example 3 (comparative) a commercial Fomblin® Z 25 sample has been used, in the Example 4 (comparative) a Fomblin® M 60 sample, in the Example 5 (comparative) a Fomblin® M 30 sample.

From the Table it is observed that the absorbance at 157 nm of these specimens is higher of about one order of magnitude than that of the compounds of the present invention.

TABLE 1

| Sample | Mn | Chlorinated end groups (meq/Kg) | η (cSt) | Absorbence (cm$^{-1}$) |
|---|---|---|---|---|
| Ex. 1 | 19,400 | 0 | 650 | 0.5 |
| Ex. 2 | 4,000 | 0 | 30 | 0.5 |
| Ex. 3 (comparative) | 15,200 | 26.6 | 260 | 5.0 |
| Es. 4 (comparative) | 19,700 | 38.3 | 600 | 7.5 |
| Es. 5 (comparative) | 15,100 | 71.8 | 280 | 12.5 |

Determination of the absorbance at 157 nm of the samples obtained in the Examples. In the Table also the following parameters are reported: number average molecular weight (Mn), kinematic viscosity (η), the amount of the chlorinated end groups expressed in meq/Kg.

The invention claimed is:

1. A process of making optical systems by immersion lithography, comprising passing a light beam through a liquid layer between an optical element and a substratum at a wave length lower than 250 nm, wherein the liquid layer comprises perfluoropolyethers having the following formula:

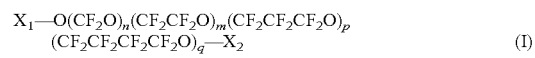

$$X_1-O(CF_2O)_n(CF_2CF_2O)_m(CF_2CF_2CF_2O)_p(CF_2CF_2CF_2CF_2O)_q-X_2 \quad (I)$$

wherein:
the repeating units —$CF_2O$—, —$CF_2CF_2O$—, —$CF_2CF_2CF_2O$—, —$CF_2CF_2CF_2CF_2O$— are statistically distributed along the chain;
—$X_1$ and —$X_2$ are perfluoroalkyl chain end groups equal to or different from each other, having formula —$(CF_2)_zCF_3$ wherein z is an integer from 0 to 3;
n, m, p, q are integers comprised between 0 and 100, with the proviso that:
at least one among n, m, p and q is different from zero;
the ratio between the oxygen atoms and the carbon atoms O/C is higher than 0.33; and
wherein chlorine atoms, determined by $^{19}$F-NMR are present in an amount lower than 1 meg/kg perfluoropolyethers of formula (I).

2. The process of claim 1, wherein the products of formula (I) have number average molecular weight from 220 to 60,000.

3. The process of claim 1, wherein the products of formula (I) are free from dissolved gases.

4. The process of claim 1, wherein the perfluoropolyethers are used as an index matching medium.

5. The process of claim 1, wherein the wave length is 157 nm.

6. The process of claim 2, wherein the number average molecular weight is from 285 to 40,000.

7. The process of claim 3, wherein the products of formula (I) are free from dissolved oxygen.

* * * * *